United States Patent
Tsuji et al.

(10) Patent No.: US 8,314,545 B2
(45) Date of Patent: Nov. 20, 2012

(54) ORGANIC ELECTROLUMINESCENCE ELEMENT

(75) Inventors: Hiroya Tsuji, Yonezawa (JP); Atsushi Oda, Kawasaki (JP)

(73) Assignees: Panasonic Corporation, Osaka (JP); Yamagata Promotional Organization for Industrial Technology, Yamagata (JP)

(*) Notice: Subject to any disclaimer, the term of this patent is extended or adjusted under 35 U.S.C. 154(b) by 442 days.

(21) Appl. No.: 11/920,007

(22) PCT Filed: May 11, 2006

(86) PCT No.: PCT/JP2006/309460
§ 371 (c)(1),
(2), (4) Date: Nov. 7, 2007

(87) PCT Pub. No.: WO2006/121105
PCT Pub. Date: Nov. 16, 2006

(65) Prior Publication Data
US 2009/0091246 A1   Apr. 9, 2009

(30) Foreign Application Priority Data
May 11, 2005   (JP) .................. 2005-139099

(51) Int. Cl.
*H01L 51/52*   (2006.01)
(52) U.S. Cl. .................. 313/504; 313/506; 428/690
(58) Field of Classification Search .................. 313/504, 313/506; 428/690
See application file for complete search history.

(56) References Cited

U.S. PATENT DOCUMENTS

| | | | |
|---|---|---|---|
| 6,566,807 B1 * | 5/2003 | Fujita et al. | 313/506 |
| 6,589,673 B1 | 7/2003 | Kido et al. | |
| 2002/0055015 A1 * | 5/2002 | Sato et al. | 428/690 |
| 2002/0113546 A1 | 8/2002 | Seo et al. | |
| 2003/0010288 A1 * | 1/2003 | Yamazaki et al. | 118/715 |
| 2003/0111666 A1 * | 6/2003 | Nishi et al. | 257/79 |
| 2003/0117069 A1 * | 6/2003 | Kato et al. | 313/504 |
| 2004/0056266 A1 * | 3/2004 | Suh et al. | 257/99 |
| 2004/0140762 A1 | 7/2004 | Tohma et al. | |
| 2004/0150330 A1 * | 8/2004 | Suh | 313/506 |
| 2004/0183066 A1 * | 9/2004 | Klubek et al. | 257/40 |
| 2004/0187911 A1 * | 9/2004 | Gaudiana et al. | 136/252 |
| 2005/0046337 A1 * | 3/2005 | Chin et al. | 313/504 |

(Continued)

FOREIGN PATENT DOCUMENTS

CN   1535090 A   10/2004

(Continued)

OTHER PUBLICATIONS

Korean Examination Report for the Application No. 10-2007-7024440 from the Korean Patent Office dated Jun. 30, 2008.

(Continued)

*Primary Examiner* — Nimeshkumar Patel
*Assistant Examiner* — Steven Horikoshi
(74) *Attorney, Agent, or Firm* — Cheng Law Group, PLLC

(57) ABSTRACT

An organic EL (electroluminescence) element capable of efficiently recombining holes and electrons in a light emitting layer and also improving efficiency and lifetime of the element. The element comprises electrodes 1 and 2, the light emitting layer 4, and transport layers 3 and 5 that transport holes and electrons to the layer 4. The layer 4 contains compound functioning as electron accepting dopant and/or substance functioning as electron donating dopant. Accordingly, it is possible to optimize the injection valance of holes or electrons into the layer 4.

17 Claims, 4 Drawing Sheets

U.S. PATENT DOCUMENTS

| | | |
|---|---|---|
| 2005/0048317 A1 | 3/2005 | Seo et al. |
| 2005/0106419 A1* | 5/2005 | Endoh et al. .................. 428/690 |
| 2005/0164019 A1* | 7/2005 | Liu et al. ....................... 428/457 |

FOREIGN PATENT DOCUMENTS

| | | | |
|---|---|---|---|
| CN | 1610469 | A | 4/2005 |
| EP | 1 089 361 | A2 | 4/2001 |
| JP | 09-139288 | A | 5/1997 |
| JP | 2000-315580 | A | 11/2000 |
| JP | 2002-184574 | A | 6/2002 |
| JP | 2002-297061 | A | 10/2002 |
| JP | 2003-51386 | A | 2/2003 |
| JP | 2003-77658 | A | 3/2003 |
| JP | 2003-282267 | A | 10/2003 |
| JP | 2003-303681 | A | 10/2003 |
| JP | 2004-362930 | A | 12/2004 |
| JP | 2005-32618 | A | 2/2005 |
| JP | 2005-63910 | A | 3/2005 |
| JP | 2005-100977 | A | 4/2005 |
| JP | 2005-108723 | A | 4/2005 |
| KR | 2002-0068963 | A | 8/2002 |
| WO | WO-00/17911 | A1 | 3/2000 |

OTHER PUBLICATIONS

International Search Report for PCT/JP2006/309460, mailed Jun. 20, 2006.
Tang, C. W. et al., "Organic electroluminescent diodes", Appl. Phys. Lett., vol. 51, No. 12, Sep. 21, 1987, pp. 913-915.
Chinese Examination Report for the Application No. 2006800160127 from the Chinese Patent Office dated Dec. 19, 2008.
The Second Office Action for the Application No. 2006800160127 from The Patent Office of the People's Replublic of China dated Jun. 26, 2009.
Supplementary European Search Report for the Application No. EP 06 74 6269 dated Feb. 9, 2011.
Notification of Reasons for Refusal for Application No. 2005-139099 from Japan Patent Office mailed Mar. 8, 2011.

* cited by examiner

ORGANIC ELECTROLUMINESCENCE ELEMENT

TECHNICAL FIELD

The invention relates to organic EL (electroluminescence) elements utilized for flat panel displays, backlights for liquid crystal displays, sign lights, lighting sources and so on.

BACKGROUND ART

Thin and light weight light-emitters with high efficiency have recently been required more and more in order to achieve thinning of flat panel displays, compacting and thinning of electronic equipments with liquid crystal displays, improving of shape-design flexibility for sign lights and luminaires, or the like. The organic EL elements are able to respond to such requirements, and the elements have been focused on.

C. W. Tang, et al. of Eastman Kodak company first disclosed that an organic EL element emitted light at a low voltage through the structure comprising electrodes and two thin films layered between the electrodes (Appl. Phys. Lett., 51,12,913(1978)). Since then, the industrial world has paid attention to various advantages of the organic EL elements, such as high intensity light emission (e.g., 100-10000 cd/m$^2$) in response to a low voltage (e.g., several voltages), multi-color light emission by combination of materials constituting the light emitting layers (active layers), availability as extremely thin plane light emitters, and so on, and has examined organic EL elements having various improved thin film structures.

A fundamental structure of an organic EL element consists of an anode, an organic light emitting layer and a cathode. But there are various structures such as: structure comprising anode, hole transport layer, organic light emitting layer, electron transport layer and cathode; structure comprising anode, hole injection layer, hole transport layer, organic light emitting layer, electron transport layer and cathode; structure comprising anode, hole injection layer, organic light emitting layer, electron transport layer, electron injection layer and cathode; structure comprising anode, hole injection layer, organic light emitting layer, electron injection layer and cathode; and so on. It is generally known that injection characteristic of holes and electrons from electrodes (anode and cathode) to an organic light emitting layer is improved by such multilayer structures, and also light emission characteristic is improved by that the organic light emitting layer is defined as a recombination region of holes and electrons. In addition, the light emission characteristics of an organic EL element is drastically improved as compared to those days through advancement of materials for an organic EL element in recent years. Also the lifetime, but there was apprehension at first, is raised to a comparatively high level. Accordingly, organic EL elements have started to be put to practical use in various applications (see Japanese Patent Application Publication Number H09-139288).

However, further improvement in efficiency and lifetime of an organic EL element has been required, and therefore improvement in the device structure is necessary in addition to that of the materials. Recombination of holes and electrons outside a light emitting layer gives the organic EL element a reduction factor of the efficiency and lifetime. There is energy loss that the recombination energy cannot contribute to emission of light. The cause of the loss is that capability for electron injection from the cathode side to the organic light emitting layer and/or hole injection from the anode side to the organic light emitting layer is low and also that valance and injection quantity of holes and electrons into the organic light emitting layer are not optimum. Consequently, in order to provide an organic EL element with high efficiency and long lifetime, it is necessary to raise the performance of an electric charge (holes and/or electrons) injection into the organic light emitting layer, and also to optimize the injection valance.

What is needed, therefore, is that holes and electrons are efficiently recombined only in the organic light emitting layer.

DISCLOSURE OF THE INVENTION

It is an object of the present invention to efficiently recombine holes and electrons in a light emitting layer and also to improve efficiency and lifetime of an organic electroluminescence element.

According to one aspect, the invention comprises electrodes, a light emitting layer, and a transport layer for transporting holes or electrons to the light emitting layer. The light emitting layer and the transport layer are formed between the electrodes. The light emitting layer contains compound functioning as electron accepting dopant. In this structure, it is possible to efficiently recombine holes and electrons in the light emitting layer and to improve the efficiency and lifetime.

According to another aspect, the light emitting layer has a region containing the compound.

According to another aspect, the light emitting layer has a first region containing the compound, and a second region that contains compound functioning as light emitting dopant.

According to another aspect, the light emitting layer further has a third region that only consists of light emitting layer host material. The third region is disposed between the first and second regions.

According to another aspect, the compound functioning as the electron accepting dopant is metal oxide.

According to another aspect, the metal oxide is selected from the group consisting of vanadium oxide, molybdenum oxide, rhenium oxide and tungsten oxide.

According to one aspect, the invention comprises electrodes, a light emitting layer, and a transport layer for transporting holes or electrons to the light emitting layer. The light emitting layer and the transport layer are formed between the electrodes. The light emitting layer contains substance functioning as electron donating dopant.

According to another aspect, the light emitting layer has a region containing the substance.

According to another aspect, the light emitting layer has a first region containing the substance, and a second region that contains compound functioning as light emitting dopant.

According to another aspect, the light emitting layer further has a third region that only consists of light emitting layer host material. The third region is disposed between the first and second regions.

According to another aspect, the substance functioning as the electron donating dopant is one or more metals selected from the group consisting of alkali metal, alkaline earth metal and rare earth metal.

BRIEF DESCRIPTION OF THE DRAWINGS

Preferred embodiments of the invention will now be described in further details. Other features and advantages of the present invention will become better understood with regard to the following detailed description and accompanying drawings where.

BEST MODE FOR CARRYING OUT THE INVENTION

Figure 1:
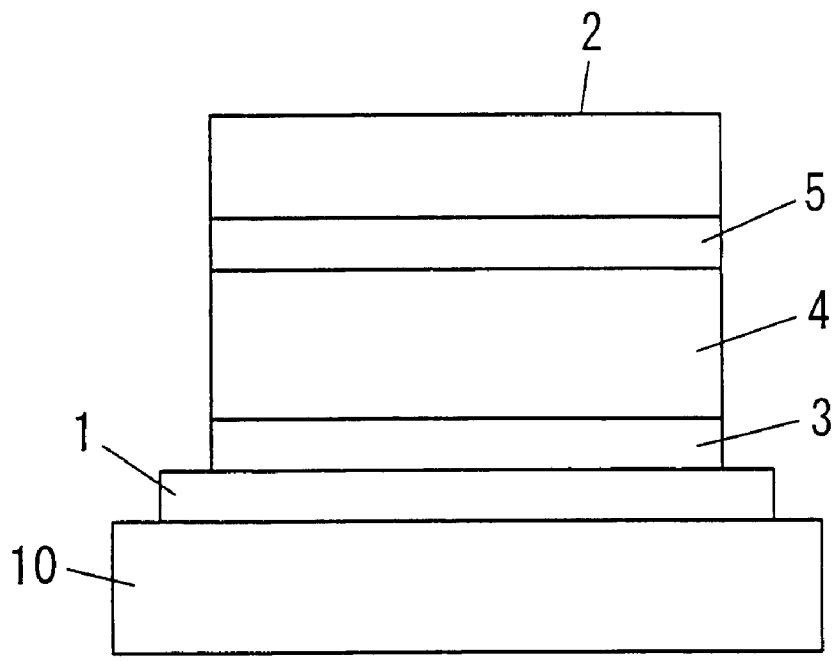
FIG. 1 is a schematic diagram showing an example of an organic electroluminescence element according to the present invention.

FIG. 1 shows an example of the structure of an organic EL (electroluminescence) element comprising electrodes 1 and 2, and an organic light emitting layer 4 layered between the electrodes. The electrode (anode) 1 is formed of a transparent conductive film and is layered on a surface of a substrate 10. The light emitting layer 4 is layered above a surface of the anode 1 through a hole transport layer 3. The electrode (cathode) 2 is layered above the light emitting layer 4 through an electron transport layer 5. However, not limited to this, for example, a hole block layer may be formed between the light emitting layer 4 and the electron transport layer 5. The light emitting layer 4 can be also formed by layering multicolor layers.

Figure 2:
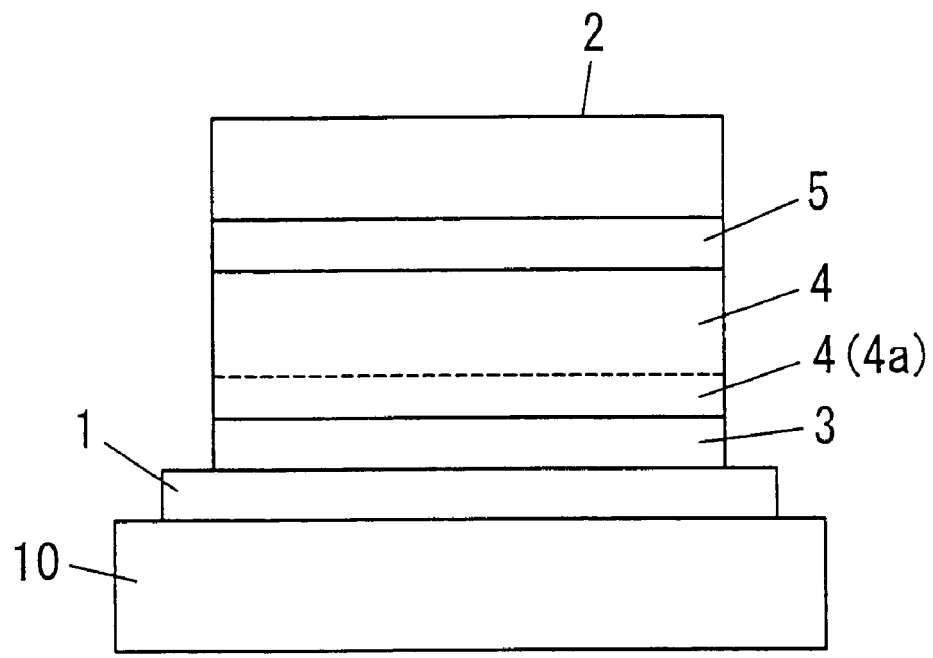
FIG. 2 is a schematic diagram showing a mode of the present invention.

In a first mode of the present invention, the light emitting layer 4 contains compound functioning as electron accepting dopant. The compound may be contained in the whole or a part of the light emitting layer 4. For example, in a mode of FIG. 2, the light emitting layer 4 has a region 4a at the anode 1 side, and the region 4a contains the compound. The number of the materials of which the region 4a is formed is different from that of the materials of which the remaining region is formed, and the region 4a contains the compound functioning as the electron accepting dopant in addition to organic light emitting compound. However, the light emitting layer 4 may contain the compound with a concentration gradient. For example, the concentration of the compound may be high at the anode 1 side and become lower from the anode 1 side to the cathode 2 side.

Figure 3:
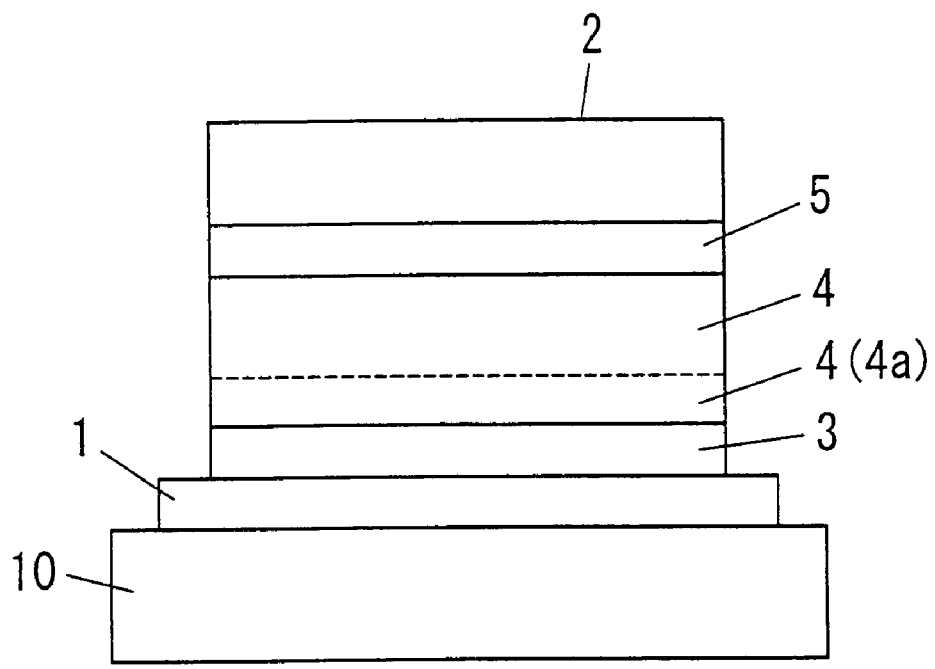
FIG. 3 is a schematic diagram showing another mode of the present invention.

In a modified mode, the light emitting layer 4 contains compound functioning as light emitting dopant. For example, in a mode of FIG. 3, the light emitting layer 4 has regions 4a and 4b, and the number of the materials of which the region 4a is formed is different from that of the materials of which the region 4b is formed. The region 4a at the anode 1 side contains compound functioning as electron accepting dopant in addition to organic light emitting compound, whereas the region 4b at the cathode 2 side contains the compound functioning as the light emitting dopant in addition to organic light emitting compound. However, the position of the compound functioning as the electron accepting dopant and/or the position of the compound functioning as the light emitting dopant may be changed.

Figure 4:
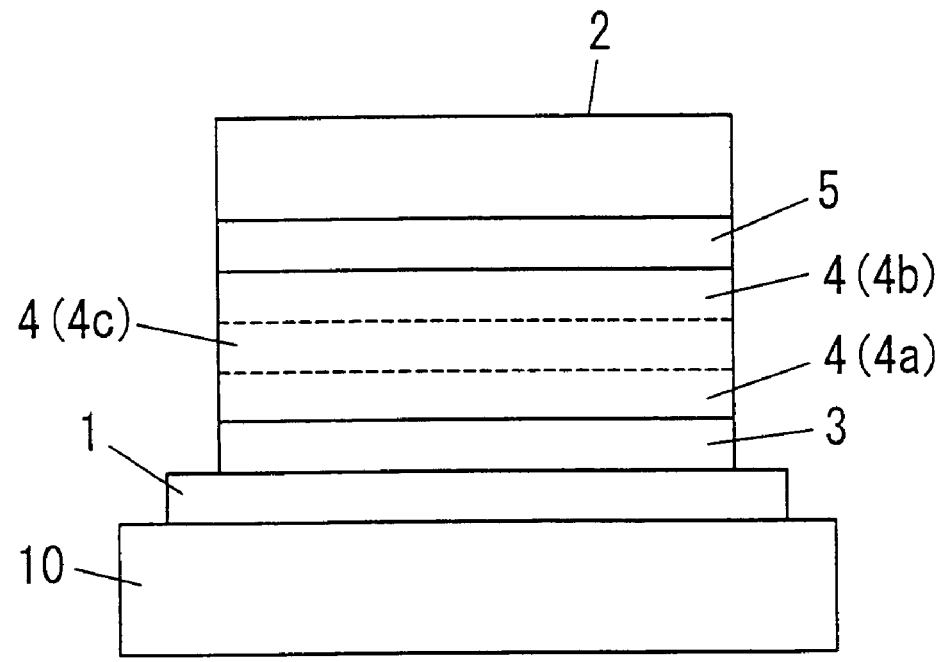
FIG. 4 is a schematic diagram showing another mode of the present invention.

In an enhanced mode of FIG. 4, the light emitting layer 4 has regions 4a, 4b and 4c which are formed of different number of materials to each other. The region 4a at the anode 1 side contains compound functioning as electron accepting dopant in addition to organic light emitting compound. The region 4b at the cathode 2 side contains compound functioning as light emitting dopant in addition to organic light emitting compound. The region 4c only consists of light emitting layer host material, and is disposed between the regions 4a and 4b. Each position of the regions may be changed.

Thus, it is possible to improve capability for hole injection into the light emitting layer 4 and/also capability for hole transport in the light emitting layer 4 by compound functioning as electron accepting dopant contained in the light emitting layer 4, and also compound functioning as electron accepting dopant and compound functioning as light emitting dopant contained in the light emitting layer 4. Moreover, the capabilities can be improved partly and selectively in the light emitting layer 4. In addition, by optimizing injection valance of holes and/or electrons into the light emitting layer, effective light emission of the light emitting layer is possible, and superior emission characteristic and lifetime characteristic can be obtained.

Figure 5:
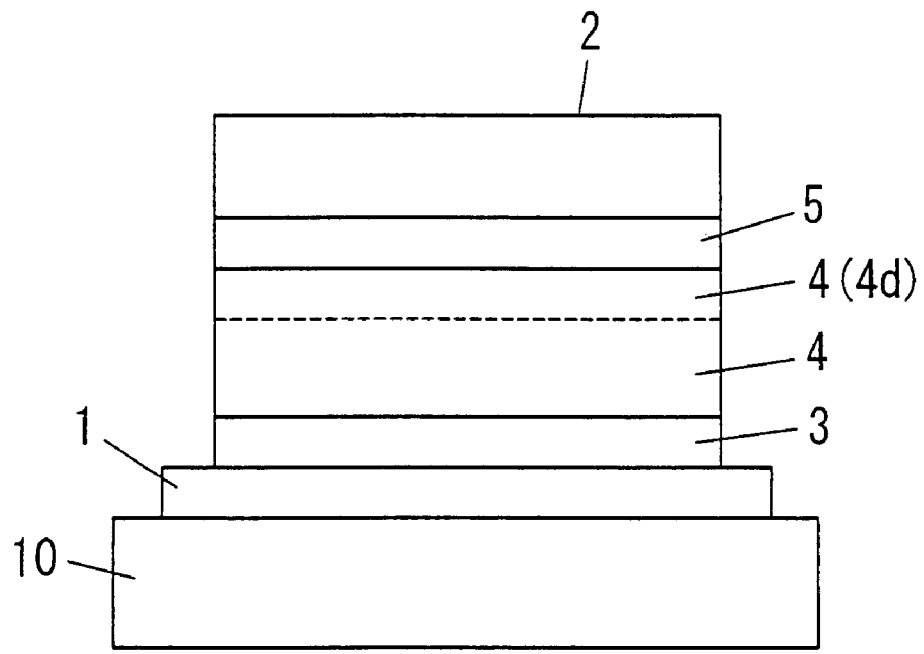
FIG. 5 is a schematic diagram showing another mode of the present invention.

In a second mode of the present invention, the light emitting layer 4 contains substance functioning as electron donating dopant. The substance may be contained in the whole or a part of the light emitting layer 4. For example, in a mode of FIG. 5, the light emitting layer 4 has regions which are formed of different number of materials to each other. A region 4d at the cathode 2 side in the regions contains the substance in addition to organic light emitting compound. However, the light emitting layer 4 may contain the substance functioning as the electron donating dopant with a concentration gradient. For example, the concentration of the substance may be high at the cathode 2 side and become lower from the cathode 2 side to the anode 1 side.

Figure 6:
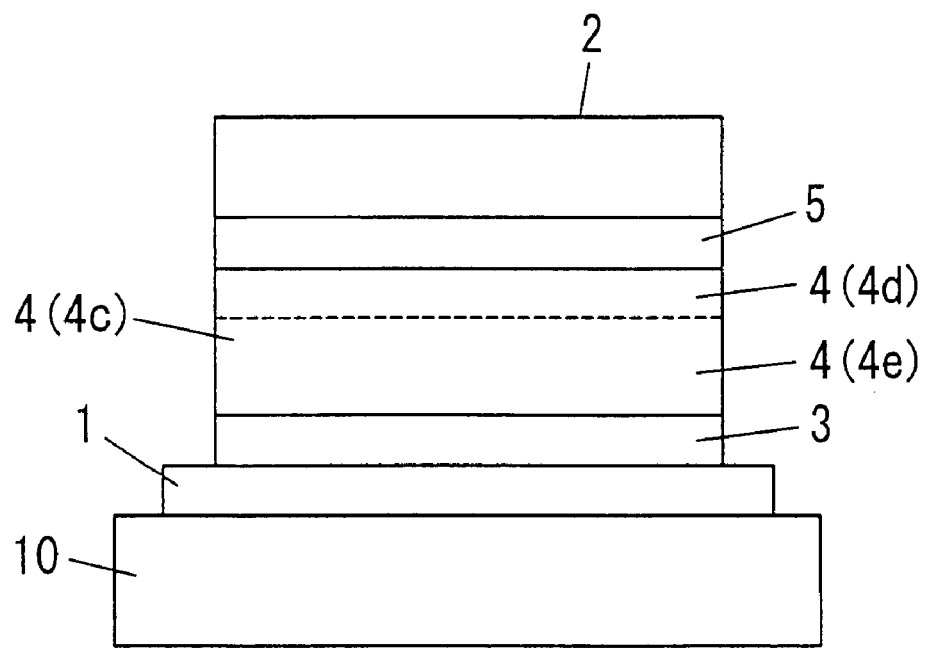
FIG. 6 is a schematic diagram showing another mode of the present invention.

In a modified mode, the light emitting layer 4 contains compound functioning as light emitting dopant. For example, in a mode of FIG. 6, the light emitting layer 4 has regions 4d and 4e which are formed of different number of materials to each other. The region 4d at the cathode 2 side contains substance functioning as electron donating dopant in addition to organic light emitting compound. The region 4e at the anode 1 side contains the compound functioning as the light emitting dopant in addition to organic light emitting compound. However, the position of the substance functioning as the electron donating dopant and/or the position of the compound functioning as the light emitting dopant may be changed.

Figure 7:
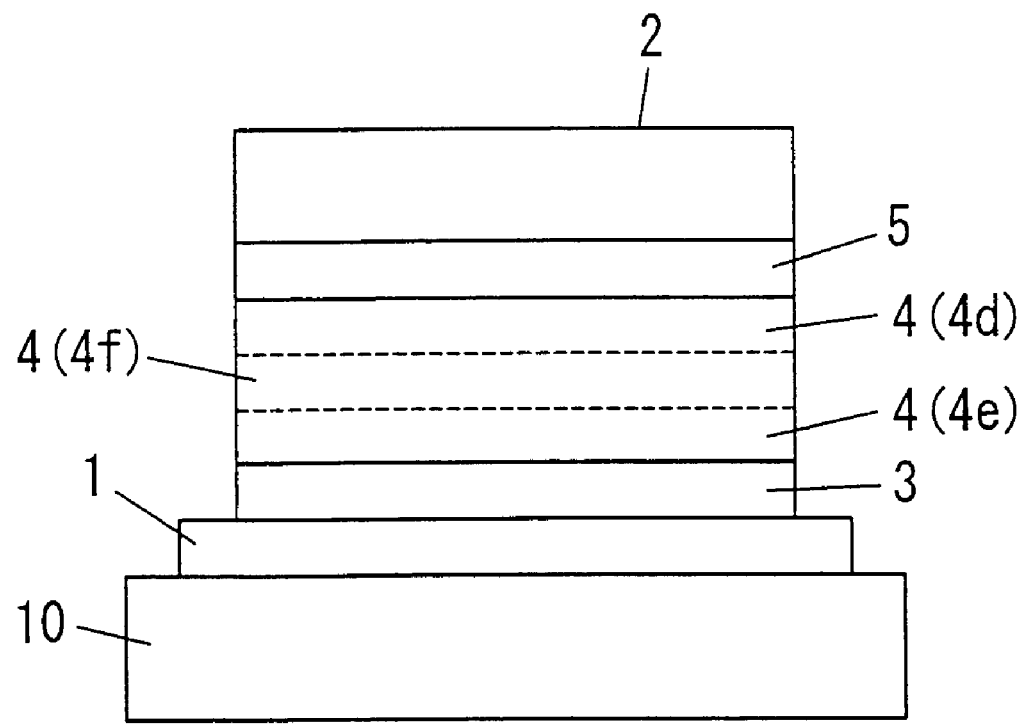
FIG. 7 is a schematic diagram showing another mode of the present invention.

In an enhanced mode of FIG. 7, the light emitting layer 4 has regions 4d, 4e and 4f which are formed of different number of materials to each other. The region 4d at the cathode 2 side contains substance functioning as electron donating dopant in addition to organic light emitting compound. The region 4e at the anode 1 side contains compound functioning as light emitting dopant in addition to organic light emitting compound. The region 4f only consists of light emitting layer host material, and is disposed between the regions 4d and 4e. Each position of the regions may be changed.

Thus, it is possible to improve capability of electron injection into the light emitting layer 4 and/also capability of electron transport in the light emitting layer 4 by substance functioning as electron donating dopant contained in the light emitting layer 4, and also substance functioning as electron donating dopant and compound functioning as light emitting dopant contained in the light emitting layer 4. Moreover, the capabilities can be improved partly and selectively in the light emitting layer 4. In addition, by optimizing injection valance of holes and/or electrons into the light emitting layer, effective light emission of the light emitting layer is possible, and superior emission characteristic and lifetime characteristic can be obtained.

In the first and the second modes, the light emitting layer 4 contains one of electron accepting dopant and electron donating dopant, but the light emitting layer of the present invention may contain both of them. The light emitting layer of the present invention may also contain one or various electron accepting dopant or electron donating dopant. For example, it is possible to make the layer 4 contain desired dopant (electron accepting dopant or electron donating dopant) by: evaporating the desired dopant during vapor deposition of particular component (light emitting layer host material and/or light emitting dopant); evaporating the particular component and the desired dopant alternately; evaporating and diffusing the desired dopant in the layer 4 after vapor deposition of the particular component; or coating solution of the particular component and the desired dopant through spin-coating; or the like. In short, the method that the particular component and the desired dopant are coexisted may be used.

The organic light emitting compound that is employed to form the light emitting layer 4 and formed as single or mixed layers is explained in detail. The light emitting layer of the present invention may contain organic light emitting compound comprised of known compounds such as, but not limited to, for example, anthracene, naphthalene, pyrene, tetracene, coronene, perylene, phthaloperylene, naftaloperylene, diphenylbutadiene, tetraphenylbutadiene, coumarin, oxadiazole, bisbenzoxazoline, bisstyryl, cyclopentadiene, quinoline metal complex, tris (8-hydroxyquinolinate) aluminum complex, tris (4-metal-8-quinolinate) aluminum complex, tris (5-phenyl-8-quinolinate) aluminum complex, aminoquinoline metal complex, benzoquinoline metal complex, tri-(p-terphenyl-4-yl)amine, 1-allyl-2, 5-di (2-thienyl) pyrrole derivative, pyran, qunacridone, rubrene, diththylbenzene derivative, distylarylene derivative, or compound having radical comprised of these light emitting compound at a part of its molecule. However, not limited to such compounds that are originally fluorescent pigments, the light emitting layer may be formed of light emitting material capable of phosphorescence emission from a state of triplet. For phosphorescence dopant, organic metal complex including metal selected from, for example, groups 7-11 of the periodic table is employed. The metal is preferably selected from the group consisting of ruthenium, rhodium, palladium, silver, rhenium, osmium, iridium, platinum and gold.

The light emitting layer host material is explained. Electron transporting material, hole transporting material or mixed material of them can be employed for the light emitting layer host material. In case of the mixed material, the light emitting layer 4 may have the concentration gradient such that the hole transporting material is much contained at the anode 1 side while the rate of the electron transporting material is higher as it approaches the cathode 2 side. The electron transporting material or the hole transporting material can be appropriately selected from, but not limited to, the group equivalent to organic light emitting compound employed for the light emitting layer 4, material for forming the hole transport layer 3, and material for forming the electron transport layer 5. The host material employed for the light emitting layer 4 in case of phosphorescence emission is selected from the group including carbazole derivative, polyvinyl carbazole and so on, besides the above host material employed for the light emitting layer in case of fluorescence emission. Light emitting dopant may be contained in host material employed for the light emitting layer 4, and the above organic light emitting compound can be employed for the light emitting dopant.

The above compound functioning as the electron accepting dopant has property that can oxidize organic matter chemically like Lewis acid, and is selected from, but not limited to, the group including: metal oxide such as vanadium oxide, molybdenum oxide, rhenium oxide, tungsten oxide and so on; inorganic compound such as ferric chloride, ferric bromide, ferric iodide, aluminum iodide, gallium chloride, gallium bromide, gallium iodide, indium chloride, indium bromide, indium iodide, antimony pentachloride, arsenic pentafluoride, boron trifluoride and so on; and organic compound such as DDQ (dicyano-dichloroquinone), TNF (trinitrofluorenone), TCNQ (tetracyanoquinodimethane), 4F-TCNQ (tetrafluoro-tetracyanoquinodimethane) and son on. The electron accepting dopant may be contained in material common to the host material of a region containing light emitting dopant or organic light emitting compound for desired emission in case of no light emitting dopant.

The above substance functioning as electron donating dopant has reduction property with respect to organic matter, and is, but not limited to, for example, at least one kind of substance selected from the group consisting of alkali metal, alkaline earth metal, rare earth metal, oxide of alkali metal, halogenide of alkali metal, oxide of alkaline earth metal, halogenide of alkaline earth metal, oxide of rare earth metal, halogenide of rare earth metal, and carbonate of alkali metal. Also, metal complex where aromatic compound coordinates with alkali metal can be employed for the electron donating dopant, but not limited to this. The electron donating dopant may be contained in material common to the host material of a region containing light emitting dopant or organic light emitting compound for desired emission in case of no light emitting dopant.

Material forming the hole transport layer 3 (or hole injection layer) is, for example, compound having hole transport capability, injection effect of holes from the anode 1, superior effect of hole injection into the light emitting layer 4, prevention effect of electron movement to the hole transport layer 3, and superior capability of thin film formation. The material is selected from, but not limited to, the group including: aromatic diamine compound such as N,N'-bis (3-methylphenyl)-(1,1'-biphenyl)-4,4' diamine (TPD) and 4,4'-bis (N-(naphthyl)-N-phenyl-amino) biphenyl (α-NPD), and so on; and high molecular material such as stilbene derivative and pyrazoline derivative and polyarylalkane and 4,4',4"-tris (N-(3-methylphenyl) N-phenylamino) triphenylamine (m-MTDATA) and 2,2',7,7'-tetrakis-(N,N-diphenylamino)-9,9'-spirobifluorene and polyvinylcarbazole, and so on.

Electron transport material forming the electron transport layer 5 is, for example, compound having electron transport capability, injection effect of electrons from the cathode 2, superior effect of electron injection into the light emitting layer 4, prevention effect of hole movement to the electron transport layer 5, and superior capability of thin film formation. The electron transport material is selected from the group including: fluorene, bathophenanthroline, bathocuproin, anthraquinodimethane, diphenoquinone, oxazole, oxadiazole, triazole, imidazole, 4,4'-N,N'-dicarbazolebiphenyl (CBP), and so on; compound of them; metal complex compound; and nitrogen-containing five-membered ring derivative. The metal complex compound is, but not limited to, tris (8-hydroxyquinolinate) aluminum; tri (2-methl-8-hydroxyquinolinate) aluminum; tris (8-hydroxyquinolinate) gallium; bis (10-hydroxybenzo[h]quinolinate) beryllium; bis (10-hydroxybenzo[h]quinolinato) zinc; bis (2-methl-8-quinolinate) (o-cresolate) gallium; bis (2-methl-8-quinolinate) (1-naphtholate) aluminum; bis (2-methl-8-quinolinate)-4-phenylphenolate; or the like. The nitrogen-containing five-membered ring derivative is preferably oxazole, thiazole, oxadiazole, thiadiazole, or triazole derivative. The triazole derivative is, but not limited to: 2,5-bis (1-phenyl)-1,3,4-oxazole; 2,5-bis (1-phenyl)-1,3,4-thiazole; 2,5-bis (1-phenyl)-1,3,4-oxadiazole; 2-(4'-tert-butylphenyl)-5-(4''-biphenyl) 1,3,4-oxadiazole; 2,5-bis (1-naphthyl)-1,3,4-oxadiazole; 1,4-bis [2-(5-phenylthiadiazolyl)] benzene; 2,5-bis (1-naphthyl)-1,3,4-triazole; 3-(4-biphenylil)-4-phenyl-5-(4-t-butylphenyl)-1,2,4-triazole; or the like. Polymer materials employed for polymer organic light emitting elements can be used—e.g., polyparaphenylene, its derivative, fluorene, its derivative, or the like.

Incidentally, in case that alkali metal or the like is doped to the transport layers 3 and 5, some high efficiency may be worked out through reduced voltage. But if electron accepting dopant or electron accepting dopant is doped to the light emitting layer 4 like the present invention, recombination probability at the light emitting layer 4 is increased so that high efficiency can be worked out.

Also, in the other materials constituting the organic EL element, e.g., substrate 10 retaining the layered element, anode 1, cathode 2 and so on, it is possible to employ the things which are conventionally utilized.

The anode 1 is an electrode for injecting holes into the light emitting layer 4. It is preferable to employ electrode material consisting of large work-function metal, alloy, electric conductive compound, or their mixture as the anode 1. It is preferable to employ electrode material of which work-function is equal to or more than 4 eV in particular. The electrode material is, for example, metal of gold or the like, conductive transparent material such as CuI, ITO (indium-tin oxide), $SnO_2$, ZnO, IZO (indium-zinc oxide) or the like. For example, the anode 1 can be manufactured as a thin film by forming the film on the substrate 10 with the electrode material by means of a method such as vacuum evaporation, sputtering or the like. In case of the structure that the light emitted from the light emitting layer 4 penetrates through the anode 1 to radiate outside from the transparent substrate 10, the optical transmittance of the anode 1 is preferable to be equal to or more than 70%. The sheet resistance of the anode 1 is also preferable to be equal to or less than several hundreds $\Omega/\square$, especially equal to or less than $100\Omega/\square$. In order to control the characteristics of the anode 1 such as the optical transmittance, sheet resistance and so on as stated above, the film thickness of the anode 1 depends on the materials but is preferable to be set to equal to or less than 500 nm in general, more preferably the range of 10-200 nm.

The cathode 2 is an electrode for injecting electrons into the light emitting layer 4. It is preferable to employ electrode material consisting of small work-function metal, alloy, electric conductive compound, or their mixture as the cathode 2. It is preferable to employ electrode material of which work-function is equal to or less than 5 eV. The electrode material is, for example: alkali metal, halide of alkali metal, oxide of alkali metal, alkaline-earth metal or the like; alloy of these and the other metal(s); or the like. For example, sodium, sodium-kalium alloy, lithium, magnesium, magnesium-silver mixture, magnesium-indium mixture, aluminum-lithium alloy, Al/LiF mixture or the like is employed. In addition, aluminum, $Al/Al_2O_3$ mixture or the like can be employed. The cathode 2 can be also manufactured by employing oxide of alkali metal, halide of alkali metal or metal oxide as the base to arrange the above material of which work-function is equal to or less than 5 eV (or alloy containing them) in one or more layers. For example, it is possible to form: layers of alkali metal and Al; layers of halide of alkali metal, alkaline-earth metal and Al; layers of $Al_2O_3$ and Al; or the like. The cathode 2 may be also manufactured as the typical transparent electrode of ITO, IZO or the like so as to form the structure in which the light emitted in the light emitting layer 4 is taken out from the cathode 2 side. Moreover, the electron transport layer 5 of the interface of the cathode 2 may be doped with: alkali metal of lithium, sodium, cesium, calcium or the like; or alkaline-earth metal.

Preferred embodiments based on the above modes as well as comparison examples for comparison with them will now be described.

In a first embodiment (Embodiment 1), a substrate 10 was a transparent glass board that was 0.7 mm in thickness. An anode 1 was a transparent electrode of which sheet resistance was $10\Omega/\square$. The anode 1 was formed on a surface of the substrate 10 by sputtering ITO (indium-tin oxide). The substrate 10 was then dried after ultrasonic cleaning with pure water and isopropyl alcohol during 10 minutes.

The substrate 10 was then set to vacuum evaporation systems to be evaporated with 2,2',7,7'-tetrakis-(N,N-diphenylamino)-9,9'-spirobifluorene (hereinafter referred to as "spiro-TAD") under decompression of $3\times10^{-5}$ Pa so as to become 150 Å in thickness. Thereby, a hole transport layer 3 was formed on the anode 1.

Then, 4,4'-N,N'-dicarbazole-biphenyl (mfd. by Nippon Steel Chemical Co., Ltd.: hereinafter referred to as "CBP") and $MoO_3$ as the electron accepting dopant were both evaporated on the hole transport layer 3 in mole ratio 1:1 so as to become 100 Å in thickness. Thereby, a region 4a doped with $MoO_3$ in the light emitting layer 4 was formed. The "CBP" was evaporated thereon to become 100 Å in thickness, so that a region 4c only consisting of the host material in the light emitting layer 4 was formed. The "CBP" and bis (2-phenylbenzothiazolate-N, C') iridium (acetylacetonat) (hereinafter referred to as "Bt2Ir(acac)") as the light emitting dopant were both evaporated thereon in weight ratio 96:4 to become 300 Å in thickness, so that a region 4b doped with the "Bt2Ir(acac)" in the light emitting layer was formed. Every evaporation speed of the above organic matters was 1-2 Å/s.

Then, 2,9-dimethyl-4,7-diphenyl-1,10-phenanthroline (mfd. by Nippon Steel Chemical Co., Ltd.: hereinafter referred to as "BCP") was evaporated on the light emitting layer 4 of the above three-layer structure to become 100 Å in thickness, so that a hole block layer (not shown) was formed. Tris (8-hydroxyquinolinate) aluminum (mfd. by Nippon Steel Chemical Co., Ltd.: hereinafter referred to as "Alq3") was evaporated thereon to become 400 Å in thickness, so that an electron transport layer 5 was formed. Finally, LiF was evaporated on the electron transport layer 5 to become 5 Å in thickness and Al was evaporated thereon in evaporation speed 5 Å/s to become 1000 Å in thickness, so that a cathode 2 was formed. Thereby, an organic EL element with such structure of FIG. 4 was obtained.

In a second embodiment (Embodiment 2), a substrate 10 having an anode 1 formed like the first embodiment was set to the vacuum evaporation systems to be evaporated with 4,4'-bis [N,N'-(3-tolyl)amino]-3,3'-dimethylbiphenyl (mfd. by Nippon Steel Chemical Co., Ltd.: hereinafter referred to as "HMTPD") under decompression of $3\times10^{-5}$ Pa so as to become 450 Å in thickness. Thereby, a hole transport layer 3 was formed on the anode 1.

Then, the "CBP" and the "Bt2Ir(acac)" as the light emitting dopant were both evaporated on the hole transport layer 3 in weight ratio 96:4 to become 300 Å in thickness, so that a region 4e doped with the "Bt2Ir(acac)" in the light emitting layer 4 was formed. The "CBP" was evaporated thereon to become 100 Å in thickness, so that a region 4f only consisting of the host material in the light emitting layer 4 was formed. The "CBP" and Cs as the electron donating dopant were both evaporated in mole ratio 1:1 to become 100 Å in thickness, so that a region 4d doped with Cs in the light emitting layer 4 was formed. Every evaporation speed of the above organic matters was 1-2 Å/s.

Then, bis (2-methyl-8-quinolinate)-4-phenylphenolate (hereinafter referred to as "BAlq") was evaporated on the light emitting layer 4 of the above three-layer structure to become 200 Å in thickness, so that an electron transport layer 5 was formed. Finally, LiF was evaporated on the electron transport layer 5 to become 5 Å in thickness and Al was evaporated thereon in evaporation speed 5 Å/s to become 1000 Å in thickness, so that a cathode 2 was formed. Thereby, an organic EL element with such structure of FIG. 7 was obtained.

In a third embodiment (Embodiment 3), a substrate 10 having an anode 1 formed like the first embodiment was set to the vacuum evaporation systems to be evaporated with the "spiro-TAD" under decompression of $3\times10^{-5}$ Pa so as to become 150 Å in thickness. Thereby, a hole transport layer 3 was formed on the anode 1.

Then, the "CBP" and "MoO$_3$" as the electron accepting dopant were both evaporated on the hole transport layer 3 in mole ratio 1:1 to become 200 Å in thickness, so that a region 4a doped with "MoO$_3$" in the light emitting layer 4 was formed. The "CBP" and the "Bt2Ir(acac)" as the light emitting dopant were both evaporated thereon in weight ratio 96:4 to become 300 Å in thickness, so that a region 4b doped with the "Bt2Ir(acac)" in the light emitting layer 4 was formed. Every evaporation speed of the above organic matters was 1-2 Å/s.

The "BCP" was then evaporated on the light emitting layer 4 of the above two-layer structure to become 100 Å in thickness, so that a hole block layer (not shown) was formed. The "Alq3" was evaporated thereon to become 400 Å in thickness, so that an electron transport layer 5 was formed. Finally, LiF was evaporated on the electron transport layer 5 to become 5 Å in thickness and Al was evaporated thereon in evaporation speed 5 Å/s to become 1000 Å in thickness, so that a cathode 2 was formed. Thereby, an organic EL element was obtained (see FIG. 1).

In a comparison example 2, a substrate 10 having an anode 1 formed like the embodiment 1 was set to the vacuum evaporation systems to be evaporated with the "HMTPD" under decompression of $3\times10^{-5}$ Pa to become 450 Å in thickness. Thereby, a hole transport layer 3 was formed on the anode 1.

Then, the "CBP" and the "Bt2Ir(acac)" as the light emitting dopant were both evaporated on the hole transport layer 3 in weight ratio 96:4 to become 300 Å in thickness, so that a light emitting layer 4 doped with the "Bt2Ir(acac)" was formed.

The "BAlq" was then evaporated on the light emitting layer 4 to become 400 Å in thickness, so that an electron transport layer 5 was formed. Finally, LiF was evaporated on the electron transport layer 5 to become 5 Å in thickness and Al was evaporated thereon in evaporation speed 5 Å/s to become 1000 Å in thickness, so that a cathode 2 was formed. Thereby, an organic EL element was obtained (see FIG. 1).

The organic EL elements obtained in the above embodiments 1-3 and comparison examples 1 and 2 were connected to a power source ("2400" mfd. by KEYTHLEY). And current density, voltage, luminance, current efficiency and external quantum efficiency were measured with multi-channel analyzer ("CS-1000" mfd. by KONICA MINOLTA CORP.). The luminance was measured with the "BM-5A" manufactured by Topcon Corp. The results are shown in Table 1.

TABLE 1

|  | Embodiment 1 | Embodiment 2 | Embodiment 3 | Comparison Example 1 | Comparison Example 2 |
| --- | --- | --- | --- | --- | --- |
| Current Density (A/m$^2$) | 10 | 10 | 10 | 10 | 10 |
| Voltage (V) | 6.9 | 7.2 | 4.3 | 6.8 | 5.0 |
| Luminance (cd/m$^2$) | 407 | 210 | 310 | 216 | 23 |
| Current Efficiency (cd/A) | 40.6 | 20.8 | 31.0 | 22.4 | 2.4 |
| External Quantum Efficiency (%) | 12.6 | 5.9 | 8.7 | 7.2 | 0.7 |

"Alq3" was evaporated thereon to become 400 Å in thickness, so that an electron transport layer 5 was formed. Finally, LiF was evaporated on the electron transport layer 5 and Al was evaporated thereon in evaporation speed 5 Å/s to become 1000 Å in thickness, so that a cathode 2 was formed. Thereby, an organic EL element with such structure of FIG. 3 was obtained.

In a comparison example 1, a substrate 10 having an anode 1 formed like the embodiment 1 was set to the vacuum evaporation systems to be evaporated with the "spiro-TAD" under decompression of $3\times10^{-5}$ Pa to become 500 Å in thickness. Thereby, a hole transport layer 3 was formed on the anode 1.

Then, the "CBP" and the "Bt2Ir(acac)" as the light emitting dopant were both evaporated on the hole transport layer 3 in weight ratio 96:4 to become 300 Å in thickness, so that a light emitting layer 4 doped with the Bt2Ir(acac) was formed.

The "BCP" was then evaporated on the light emitting layer 4 to become 100 Å in thickness, so that a hole block layer was In each embodiment, it is confirmed that luminance is high and also current efficiency and external quantum efficiency are high, as shown in comparison of: the embodiment 1 and the comparison example 1; and the example 2 and the comparison example 2 in Table 1.

Although the present invention has been described with reference to certain preferred embodiments, numerous modifications and variations can be made by those skilled in the art without departing from the true spirit and scope of this invention.

The invention claimed is:

1. An organic electroluminescence element, comprising electrodes, a light emitting layer, a hole transport layer for transporting holes to the light emitting layer, and an electron transport layer for transporting electrons to the light emitting layer, wherein said light emitting layer, said hole transport layer and said electron transport layer are formed between the electrodes, while the light emitting layer is formed between said hole transport layer and said electron transport layer, and wherein the light emitting layer has a first region, and a second region, said first region being formed at the side of the hole transport layer, said first region containing light emitting layer host material and a compound functioning as an electron accepting dopant, and said second region being formed at the side of the electron transport layer, said second region containing light emitting layer host material and a compound functioning as a light emitting dopant, wherein said compound functioning as an electron accepting dopant differs from material forming the hole transport layer.

2. The organic electroluminescence element of claim 1, wherein said compound functioning as an electron accepting dopant is capable of oxidizing organic matter chemically like a Lewis acid.

3. The organic electroluminescence element of claim 1, wherein said compound functioning as an electron accepting dopant is selected from the group including: metal oxide such as vanadium oxide, molybdenum oxide, rhenium oxide, and tungsten oxide; inorganic compound such as ferric chloride, ferric bromide, ferric iodide, aluminum iodide, gallium chloride, gallium bromide, gallium iodide, indium chloride, indium bromide, indium iodide, and antimony pentachloride, arsenic pentafluoride, boron trifluoride; and organic compound such as DDQ (dicyano-dichloroquinone), TNF (trinitrofluorenone), TCNQ (tetracyanoquinodimethane), and 4F-TCNQ (tetrafluoro-tetracyanoquinodimethane).

4. The organic electroluminescence element of claim 2, wherein material forming the hole transport layer is selected from the group including: aromatic diamine compound such as N,N'-bis (3-methylphenyl)-(1,1'-biphenyl)-4,4' diamine (TPD) and 4,4'-bis (N-(naphthyl)-N-phenyl-amino) biphenyl (α-NPD); and high molecular material such as stilbene derivative and pyrazoline derivative and polyarylalkane and 4,4',4"-tris (N-(3-methylphenyl) N-phenylamino) triphenylamine (m-MTDATA) and 2,2',7,7'-tetrakis-(N,N-diphenylamino)-9, 9'-spirobifluorene and polyvinylcarbazole.

5. The organic electroluminescence element of claim 3, wherein material forming the hole transport layer is selected from the group including: aromatic diamine compound such as N,N'-bis (3-methylphenyl)-(1,1'-biphenyl)-4,4' diamine (TPD) and 4,4'-bis (N-(naphthyl)-N-phenyl-amino) biphenyl (α-NPD); and high molecular material such as stilbene derivative and pyrazoline derivative and polyarylalkane and 4,4',4"-tris (N-(3-methylphenyl) N-phenylamino) triphenylamine (m-MTDATA) and 2,2',7,7'-tetrakis-(N,N-diphenylamino)-9, 9'-spirobifluorene and polyvinylcarbazole.

6. An organic electroluminescence element, comprising electrodes, a light emitting layer, a hole transport layer for transporting holes to the light emitting layer, and an electron transport layer for transporting electrons to the light emitting layer, wherein said light emitting layer, said hole transport layer and said electron transport layer are formed between the electrodes, while the light emitting layer is formed between said hole transport layer and said electron transport layer, and wherein the light emitting layer has a first region, a second region, and a third region, said first region being formed at the side of the hole transport layer, said first region containing light emitting layer host material and a compound functioning as an electron accepting dopant, said second region being formed at the side of the electron transport layer, said second region containing light emitting layer host material and a compound functioning as a light emitting dopant, and said third region being disposed between the first and second regions, said third region only consisting of light emitting layer host material, and wherein said compound functioning as an electron accepting dopant differs from material forming the hole transport layer.

7. The organic electroluminescence element of claim 6, wherein said compound functioning as an electron accepting dopant is capable of oxidizing organic matter chemically like a Lewis acid.

8. The organic electroluminescence element of claim 6, wherein said compound functioning as an electron accepting dopant is selected from the group including: metal oxide such as vanadium oxide, molybdenum oxide, rhenium oxide, and tungsten oxide; inorganic compound such as ferric chloride, ferric bromide, ferric iodide, aluminum iodide, gallium chloride, gallium bromide, gallium iodide, indium chloride, indium bromide, indium iodide, and antimony pentachloride, arsenic pentafluoride, boron trifluoride; and organic compound such as DDQ (dicyano-dichloroquinone), TNF (trinitrofluorenone), TCNQ (tetracyanoquinodimethane), and 4F-TCNQ (tetrafluoro-tetracyanoquinodimethane).

9. The organic electroluminescence element of claim 7, wherein material forming the hole transport layer is selected from the group including: aromatic diamine compound such as N,N'-bis (3-methylphenyl)-(1,1'-biphenyl)-4,4' diamine (TPD) and 4,4'-bis (N-(naphthyl)-N-phenyl-amino) biphenyl (α-NPD); and high molecular material such as stilbene derivative and pyrazoline derivative and polyarylalkane and 4,4',4"-tris (N-(3-methylphenyl) N-phenylamino) triphenylamine (m-MTDATA) and 2,2',7,7'-tetrakis-(N,N-diphenylamino)-9,9'-spirobifluorene and polyvinylcarbazole.

10. The organic electroluminescence element of claim 8, wherein material forming the hole transport layer is selected from the group including: aromatic diamine compound such as N,N'-bis (3-methylphenyl)-(1,1'-biphenyl)-4,4' diamine (TPD) and 4, 4'-bis (N-(naphthyl)-N-phenyl-amino) biphenyl (α-NPD); and high molecular material such as stilbene derivative and pyrazoline derivative and polyarylalkane and 4,4',4"-tris (N-(3-methylphenyl) N-phenylamino) triphenylamine (m-MTDATA) and 2,2',7,7'-tetrakis-(N,N-diphenylamino)-9,9'-spirobifluorene and polyvinylcarbazole.

11. An organic electroluminescence element, comprising electrodes, a light emitting layer, and a hole transport layer for transporting holes to the light emitting layer, and an electron transport layer for transporting electrons to the light emitting layer, wherein said light emitting layer, said hole transport layer and said electron transport layer are formed between the electrodes, while the light emitting layer is formed between said hole transport layer and said electron transport layer, and wherein the light emitting layer has a first region, a second region, and a third region, said first region being formed at the side of the hole transport layer, said first region containing light emitting layer host material and a compound functioning as a light emitting dopant, said second region being formed at the side of the electron transport layer, said second region containing light emitting layer host material and a substance functioning as an electron donating dopant, and said third region being disposed between the first and second regions, said third region only consisting of light emitting layer host material, wherein said substance functioning as an electron donating dopant differs from material forming the electron transport layer.

12. The organic electroluminescence element of claim 11, wherein said substance functioning as an electron donating dopant has reduction property with respect to organic matter.

13. The organic electroluminescence element of claim 11, wherein said substance functioning as an electron donating dopant is at least one kind of substance selected from the group consisting of alkali metal, alkaline earth metal, rare earth metal, oxide of alkali metal, halogenide of alkali metal, oxide of alkaline earth metal, halogenide of alkaline earth metal, oxide of rare earth metal, halogenide of rare earth metal, and carbonate of alkali metal.

14. The organic electroluminescence element of claim 11, wherein material forming the electron transport layer is metal complex where aromatic compound coordinates with alkali metal.

15. The organic electroluminescence element of claim 12,
wherein material forming the electron transport layer is selected from the group including: fluorene, bathophenanthroline, bathocuproin, anthraquinodimethane, diphenoquinone, oxazole, oxadiazole, triazole, imidazole, and 4, 4'-N,N'-dicarbazolebiphenyl (CBP); compound of them; metal complex compound; and nitrogen-containing five-membered ring derivative, wherein the metal complex compound is tris (8-hydroxyquinolinate) aluminum; tri(2-methyl-8-hydroxyquinolinate) aluminum; tris (8-hydroxyquinolinate) gallium; bis (10-hydroxybenzo[h]quinolinate) beryllium; bis (10-hydroxybenzo[h]quinolinato) zinc; bis (2-methyl-8-quinolinate) (o-cresolate) gallium; bis (2-methyl-8-quinolinate) (1-naphtholate) aluminum; or bis (2-methl-8-quinolinate)-4-phenylphenolate, wherein the nitrogen-containing five-membered ring derivative is oxazole, thiazole, oxadiazole, thiadiazole, or triazole derivative, wherein the triazole derivative is: 2,5-bis (1-phenyl)-1,3,4-oxazole; 2,5-bis (1-phenyl)-1,3,4-thiazole; 2,5-bis (1-phenyl)-1,3,4-oxadiazole; 2-(4'-tert-butylphenyl)-5-(4"-biphenyl) 1, 3,4-oxadiazole; 2,5-bis (1-naphthyl)-1,3,4-oxadiazole; 1,4-bis[2-(5-phenylthiadiazolyl)]benzene; 2,5-bis (1-naphthyl)-1,3,4-triazole; or 3-(4-biphenylil)-4-phenyl-5-(4-t-butylphenyl)-1,2,4-triazole.

16. The organic electroluminescence element of claim 13,
wherein material forming the electron transport layer is selected from the group including: fluorene, bathophenanthroline, bathocuproin, anthraquinodimethane, diphenoquinone, oxazole, oxadiazole, triazole, imidazole, and 4,4'-N,N'-dicarbazolebiphenyl (CBP); compound of them; metal complex compound; and nitrogen-containing five-membered ring derivative, wherein the metal complex compound is tris (8-hydroxyquinolinate) aluminum; tri (2-methl-8-hydroxyquinolinate) aluminum; tris (8-hydroxyquinolinate) gallium; bis (10-hydroxybenzo[h]quinolinate) beryllium; bis (10-hydroxybenzo[h]quinolinato) zinc; bis (2-methyl-8-quinolinate) (o-cresolate) gallium; bis (2-methyl-8-quinolinate) (1-naphtholate) aluminum; or bis (2-methyl-8-quinolinate)-4-phenylphenolate, wherein the nitrogen-containing five-membered ring derivative is oxazole, thiazole, oxadiazole, thiadiazole, or triazole derivative, wherein the triazole derivative is: 2,5-bis (1-phenyl)-1,3,4-oxazole; 2, 5-bis (1-phenyl)-1,3,4-thiazole; 2,5-bis (1-phenyl)-1,3,4-oxadiazole; 2-(4'-tert-butylphenyl)-5-(4"-biphenyl) 1, 3,4-oxadiazole; 2,5-bis (1-naphthyl)-1,3,4-oxadiazole; 1,4-bis[2-(5-phenylthiadiazolyl)]benzene; 2,5-bis (1-naphthyl)-1,3,4-triazole; or 3-(4-biphenylil)-4-phenyl-5-(4-t-butylphenyl)-1,2,4-triazole.

17. The organic electroluminescence element of claim 14,
wherein material forming the electron transport layer is selected from the group including: fluorene, bathophenanthroline, bathocuproin, anthraquinodimethane, diphenoquinone, oxazole, oxadiazole, triazole, imidazole, and 4,4'-N,N'-dicarbazolebiphenyl (CBP); compound of them; and nitrogen-containing five-membered ring derivative, wherein the nitrogen-containing five-membered ring derivative is oxazole, thiazole, oxadiazole, thiadiazole, or triazole derivative, wherein the triazole derivative is: 2,5-bis (1-phenyl)-1,3,4-oxazole; 2,5-bis (1-phenyl)-1,3,4-thiazole; 2,5-bis (1-phenyl)-1,3,4-oxadiazole; 2-(4'-tert-butylphenyl)-5-(4"-biphenyl) 1, 3,4-oxadiazole; 2,5-bis (1-naphthyl)-1,3,4-oxadiazole; 1,4-bis[2-(5-phenylthiadiazolyl)]benzene; 2,5-bis (1-naphthyl)-1,3,4-triazole; or 3-(4-biphenylil)-4-phenyl-5-(4-t-butylphenyl)-1,2,4-triazole.

* * * * *